(12) United States Patent
Aronovich et al.

(10) Patent No.: US 9,747,055 B2
(45) Date of Patent: *Aug. 29, 2017

(54) SCALABLE DEDUPLICATION SYSTEM WITH SMALL BLOCKS

(71) Applicant: INTERNATIONAL BUSINESS MACHINES CORPORATION, Armonk, NY (US)

(72) Inventors: Lior Aronovich, Toronto (CA); Ron Asher, Tel Aviv (IL); Michael Hirsch, Mazkeret Batya (IL); Shmuel T. Klein, Rehovot (IL); Ehud Meiri, Tel Aviv (IL); Yair Toaff, Givat Shmuel (IL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 66 days.

This patent is subject to a terminal disclaimer.

(21) Appl. No.: 14/733,507

(22) Filed: Jun. 8, 2015

(65) Prior Publication Data
US 2015/0286443 A1 Oct. 8, 2015

Related U.S. Application Data

(63) Continuation of application No. 13/929,262, filed on Jun. 27, 2013, now Pat. No. 9,075,842, which is a (Continued)

(51) Int. Cl.
*G06F 7/00* (2006.01)
*G06F 3/06* (2006.01)
(Continued)

(52) U.S. Cl.
CPC ........... *G06F 3/0641* (2013.01); *G06F 3/067* (2013.01); *G06F 3/0608* (2013.01); *G06F 7/00* (2013.01);
(Continued)

(58) Field of Classification Search
CPC ...... G06F 3/0641; G06F 3/067; G06F 3/0608; G06F 7/00; G06F 17/30159;
(Continued)

(56) References Cited

U.S. PATENT DOCUMENTS 3,694,813 A * 9/1972 Loh .................. H03M 7/42
710/30
3,717,851 A 2/1973 Cocke et al.
(Continued)

FOREIGN PATENT DOCUMENTS

CN 101630290 A 1/2010
CN 101908077 A 12/2010
(Continued)

OTHER PUBLICATIONS

Klein et al., "Huffman Coding with Non-Sorted Frequencies", in Proceedings of the Prague Stringology Conference, 2008, 9 pages.*
(Continued)

*Primary Examiner* — Phuong Thao Cao
(74) *Attorney, Agent, or Firm* — Griffiths & Seaton PLLC

(57) ABSTRACT

Exemplary method, system, and computer program product embodiments for scalable data deduplication working with small data chunk in a computing environment are provided. In one embodiment, by way of example only, for each small data chunk, a signature is generated based on a combination of a representation of characters used in selecting data to be deduplicated. A c-spectrum of the small data chunk being a sequence of representations of different characters ordered by a frequency of occurrence in the small data chunk, and an f-spectrum of the small data chunk being a corresponding sequence of frequencies of the different characters in the small data chunk.

15 Claims, 9 Drawing Sheets

Related U.S. Application Data continuation of application No. 13/534,361, filed on Jun. 27, 2012, now Pat. No. 8,478,730, which is a continuation of application No. 13/236,552, filed on Sep. 19, 2011, now Pat. No. 8,484,170.

(51) Int. Cl.
*G06F 17/30* (2006.01)
*H03M 7/30* (2006.01)

(52) U.S. Cl.
CPC .. *G06F 17/30159* (2013.01); *G06F 17/30303* (2013.01); *G06F 17/30371* (2013.01); *H03M 7/3091* (2013.01); *H03M 7/3093* (2013.01)

(58) Field of Classification Search
CPC ........ G06F 17/30371; G06F 17/30303; H03M 7/3093; H03M 7/3091
USPC ....................................................... 707/692
See application file for complete search history.

(56) References Cited

U.S. PATENT DOCUMENTS

| | | | |
|---|---|---|---|
| 4,192,010 A * | 3/1980 | Kerner | H03M 7/42 341/107 |
| 4,359,286 A * | 11/1982 | Barnes | G06F 17/214 358/1.11 |
| 4,516,246 A * | 5/1985 | Kenemuth | H03M 7/40 341/107 |
| 4,672,679 A | 6/1987 | Freeman | |
| 5,276,741 A | 1/1994 | Aragon | |
| 5,469,354 A | 11/1995 | Hatakeyama et al. | |
| 5,870,750 A | 2/1999 | Oyama et al. | |
| 6,026,198 A | 2/2000 | Okada | |
| 6,128,412 A * | 10/2000 | Satoh | H03M 7/40 382/228 |
| 6,215,906 B1 | 4/2001 | Okada | |
| 6,304,601 B1 * | 10/2001 | Davison | H03M 7/42 341/106 |
| 6,542,644 B1 * | 4/2003 | Satoh | H03M 7/40 375/240.23 |
| 7,016,908 B2 * | 3/2006 | Kataoka | G06F 3/0608 |
| 7,259,751 B2 | 8/2007 | Hughes et al. | |
| 7,310,055 B2 | 12/2007 | Odagiri | |
| 7,516,130 B2 | 4/2009 | Ren et al. | |
| 7,689,633 B1 | 3/2010 | Li et al. | |
| 7,733,247 B1 | 6/2010 | He et al. | |
| 7,777,651 B2 | 8/2010 | Fallon et al. | |
| 7,783,889 B2 | 8/2010 | Srinivasan | |
| 7,831,531 B1 | 11/2010 | Baluja et al. | |
| 7,882,083 B2 * | 2/2011 | Kataoka | G06F 17/30979 707/692 |
| 8,015,162 B2 * | 9/2011 | Henzinger | G06F 17/2211 707/692 |
| 8,055,599 B1 | 11/2011 | Werth | |
| 8,099,415 B2 | 1/2012 | Luo et al. | |
| 8,121,993 B2 | 2/2012 | Blount et al. | |
| 8,141,149 B1 * | 3/2012 | Henry | G06F 11/3006 370/394 |
| 8,156,306 B1 | 4/2012 | Raizen et al. | |
| 8,209,334 B1 | 6/2012 | Doerner | |
| 8,595,196 B2 * | 11/2013 | Kataoka | G06F 17/30911 707/693 |
| 8,898,114 B1 | 11/2014 | Feathergill et al. | |
| 2002/0078062 A1 * | 6/2002 | Kataoka | G06F 3/0608 |
| 2004/0205257 A1 | 10/2004 | Hughes et al. | |
| 2005/0122240 A1 | 6/2005 | Kim et al. | |
| 2006/0106769 A1 | 5/2006 | Gibbs | |
| 2006/0171588 A1 | 8/2006 | Chellapilla et al. | |
| 2006/0253438 A1 * | 11/2006 | Ren | G06F 17/30616 |
| 2007/0096953 A1 * | 5/2007 | Odagiri | H03M 7/3084 341/50 |
| 2007/0130188 A1 | 6/2007 | Moon et al. | |
| 2007/0156749 A1 * | 7/2007 | Levin | G06N 99/005 |
| 2007/0174209 A1 | 7/2007 | Fallon et al. | |
| 2007/0282832 A1 | 12/2007 | Herley et al. | |
| 2008/0065630 A1 * | 3/2008 | Luo | G06F 17/30569 |
| 2008/0167881 A1 * | 7/2008 | Haas | G06T 1/0042 704/500 |
| 2008/0281811 A1 * | 11/2008 | Korst | G06F 17/30616 |
| 2009/0234826 A1 * | 9/2009 | Bidlack | G06F 17/30489 |
| 2009/0271454 A1 * | 10/2009 | Anglin | G06F 17/30371 |
| 2009/0287839 A1 | 11/2009 | Fallon et al. | |
| 2009/0300321 A1 | 12/2009 | Balachandran et al. | |
| 2010/0125553 A1 | 5/2010 | Huang et al. | |
| 2010/0188273 A1 | 7/2010 | He et al. | |
| 2010/0235332 A1 | 9/2010 | Haustein et al. | |
| 2010/0254615 A1 | 10/2010 | Kantor et al. | |
| 2010/0306148 A1 | 12/2010 | Johnston | |
| 2010/0306412 A1 | 12/2010 | Therrien et al. | |
| 2011/0099200 A1 | 4/2011 | Blount | |
| 2011/0099351 A1 | 4/2011 | Condict | |
| 2012/0011115 A1 | 1/2012 | Madhavan et al. | |
| 2012/0016882 A1 | 1/2012 | Tofano | |
| 2012/0066214 A1 | 3/2012 | Nelke et al. | |
| 2012/0089579 A1 | 4/2012 | Ranade et al. | |
| 2012/0089775 A1 | 4/2012 | Ranade et al. | |
| 2012/0303663 A1 | 11/2012 | Asikainen et al. | |
| 2014/0059075 A1 * | 2/2014 | Kataoka | G06F 17/30 707/769 |

FOREIGN PATENT DOCUMENTS

| | | |
|---|---|---|
| CN | 102185889 A | 9/2011 |
| JP | 04280517 | 10/1992 |
| JP | 2005333233 A | 12/2005 |
| WO | 2010114856 A1 | 10/2010 |

OTHER PUBLICATIONS

"A Low Cost Worm Detection Technique Based on Flow Payload Similarity" 4 pages, In the Third International Conference on Web Information Systems and Technologies (WEBIST 2007).

Ogawa et al., "A New Character-based Indexing Method using Frequency Data for Japanese Documents" pp. 121-129, 1995.

Musa et al., "An Efficient Text Compression Technique Based on Using Bitwise Lempel-Ziv Algorithm" pp. 6564-6569 Australian Journal of Basic and Applied Sciences.

Lam et al., "Chinese Document Indexing Based on a New Partitioned Signature File: Model and Evaluation" pp. 584-597, Journal of the American Society for Information Science and Technology, May 2001, col. 52, No. 7.

Gagie et al., "Dynamic Shannon Coding" 6 pages IEEE 2005.

Bhagwat et al., "Extreme Binning: Scalable, Parallel Deduplication for Chunk-based File Backup" 9 pages, Proceedings of the 17th IEEE/ACM International Symposium on Modeling, Analysis and Simulation of Computer and Telecommunications Systems (MASCOTS'2009), Sep. 2009.

Lu et al., "Frequency Based Chunking for Data De-Duplication" pp. 287-296, 2010.

Narang et al., "Real-time Approximate Range Motif Discovery & Data Redundancy Removal Algorithm" 12 pages, EDBT 2011, Mar. 22-24, 2011, ACM 978-1-4503-0528-1/11/0003, Uppsala, Sweden.

\* cited by examiner

500

```
int cshift[11][11] =
{ 0,0, 0, 0, 0, 0, 0, 0, 0, 0, 0,   /* 0 */
  0,26,0, 0, 0, 0, 0, 0, 0, 0, 0,   /* 1 */
  0,26,14,0, 0, 0, 0, 0, 0, 0, 0,   /* 2 */
  0,26,15,12,0, 0, 0, 0, 0, 0, 0,   /* 3 */
  0,26,24,14,11,0, 0, 0, 0, 0, 0,   /* 4 */
  0,26,24,16,13,10,0, 0, 0, 0, 0,   /* 5 */
  0,26,24,17,14,11, 8,0, 0, 0, 0,   /* 6 */
  0,26,24,17,14,12,10, 8,0, 0, 0,   /* 7 */
  0,26,24,18,15,12, 9, 6,3, 0, 0,   /* 8 */
  0,26,24,17,14,11, 9, 7, 5,3, 0,   /* 9 */
  0,26,24,18,16,13,11, 9, 7, 5,3    /* 10 */ } int fshift[11][24] =
{ 0,0,0,0,0,0,0,0,0,0, 0, 0, 0, 0, 0, 0, 0, 0, 0, 0, 0, 0, 0, 0,  /* 0 */
  0,0,0,0,1,1,1,1,2,2, 2, 3, 3, 3, 4, 4, 4, 5, 5, 5, 6, 6, 6, 0,  /* 1 */
  0,0,0,0,1,1,1,1,2,2, 2, 3, 3, 3, 4, 4, 4, 5, 5, 5, 6, 6, 6, 0,  /* 2 */
  0,0,0,0,1,1,1,1,2,2, 2, 3, 3, 3, 4, 4, 4, 5, 5, 5, 0, 0, 0, 0,  /* 3 */
  0,0,0,0,1,1,1,1,2,2, 2, 3, 3, 3, 4, 4, 4, 5, 5, 5, 0, 0, 0, 0,  /* 4 */
  0,0,0,0,1,1,1,1,2,2, 2, 3, 3, 3, 4, 4, 4, 5, 5, 5, 0, 0, 0, 0,  /* 5 */
  0,0,0,0,1,1,1,1,2,2, 2, 3, 3, 3, 4, 4, 4, 5, 5, 5, 0, 0, 0, 0,  /* 6 */
  0,0,0,1,1,2,2,3,3,4, 4, 5, 5, 6, 6, 6, 0, 0, 0, 0, 0, 0, 0, 0,  /* 7 */
  0,0,0,1,1,2,2,3,3,4, 4, 5, 5, 6, 6, 6, 0, 0, 0, 0, 0, 0, 0, 0,  /* 8 */
  0,0,0,1,1,2,2,3,3,4, 4, 5, 5, 6, 6, 6, 0, 0, 0, 0, 0, 0, 0, 0,  /* 9 */
  0,0,0,1,1,2,2,3,3,4, 4, 5, 5, 6, 6, 6, 0, 0, 0, 0, 0, 0, 0, 0}; /* 10 */ int pshift[11][4] =
{ 0, 0, 0, 0,     /* 0 */
  0, 2, 11, 20,   /* 1 */
  0, 3, 20, 0,    /* 2 */
  0, 3, 20, 0,    /* 3 */
  0, 3, 20, 0,    /* 4 */
  0, 3, 20, 0,    /* 5 */
  0, 3, 20, 0,    /* 6 */
  0, 3, 20, 0,    /* 7 */
  0, 20, 0, 0,    /* 8 */
  0, 20, 0, 0,    /* 9 */
  0, 20, 0, 0};   /* 10 */
```

SCALABLE DEDUPLICATION SYSTEM WITH SMALL BLOCKS

CROSS-REFERENCE TO RELATED APPLICATIONS

This Application is a Continuation of U.S. patent Ser. No. 13/929,262, filed on Jun. 27, 2013, now U.S. Pat. No. 9,075,842, which is a Continuation of U.S. patent application Ser. No. 13/534,361, filed on Jun. 27, 2012, now U.S. Pat. No. 8,478,730, which is a Continuation of U.S. patent application Ser. No. 13/236,552, filed on Sep. 19, 2011, now U.S. Pat. No. 8,484,170.

BACKGROUND OF THE INVENTION

Field of the Invention

The present invention relates in general to computers, and more particularly to scalable deduplication in which fine-grained resolution is required to enable access to small data blocks in a computing storage environment.

Description of the Related Art

In today's society, computer systems are commonplace. Computer systems may be found in the workplace, at home, or at school. Computer systems may include data storage systems, or disk storage systems, to process and store data. Large amounts of data have to be processed daily and the current trend suggests that these amounts will continue being ever-increasing in the foreseeable future. An efficient way to alleviate the problem is by using deduplication. The idea underlying a deduplication system is to exploit the fact that large parts of the available data is copied again and again and forwarded without any change, by locating repeated data and storing only its first occurrence. Subsequent copies are replaced with pointers to the stored occurrence, which significantly reduces the storage requirements if the data is indeed repetitive.

SUMMARY OF THE DESCRIBED EMBODIMENTS

Various exemplary method, system, and computer program product embodiments for scalable data deduplication working with small data chunk in a computing environment are provided. In one embodiment, by way of example only, for each small data chunk, a signature is generated based on a combination of a representation of characters used in selecting data to be deduplicated. A c-spectrum of the small data chunk being a sequence of representations of different characters ordered by a frequency of occurrence in the small data chunk, and an f-spectrum of the small data chunk being a corresponding sequence of frequencies of the different characters in the small data chunk.

In addition to the foregoing exemplary method embodiment, other exemplary system and computer product embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which:

FIG. 8 defines the shift constants used in the flowcharts of FIGS. 7a, 7b and 7c.

DETAILED DESCRIPTION OF THE DRAWINGS

Figure 1:
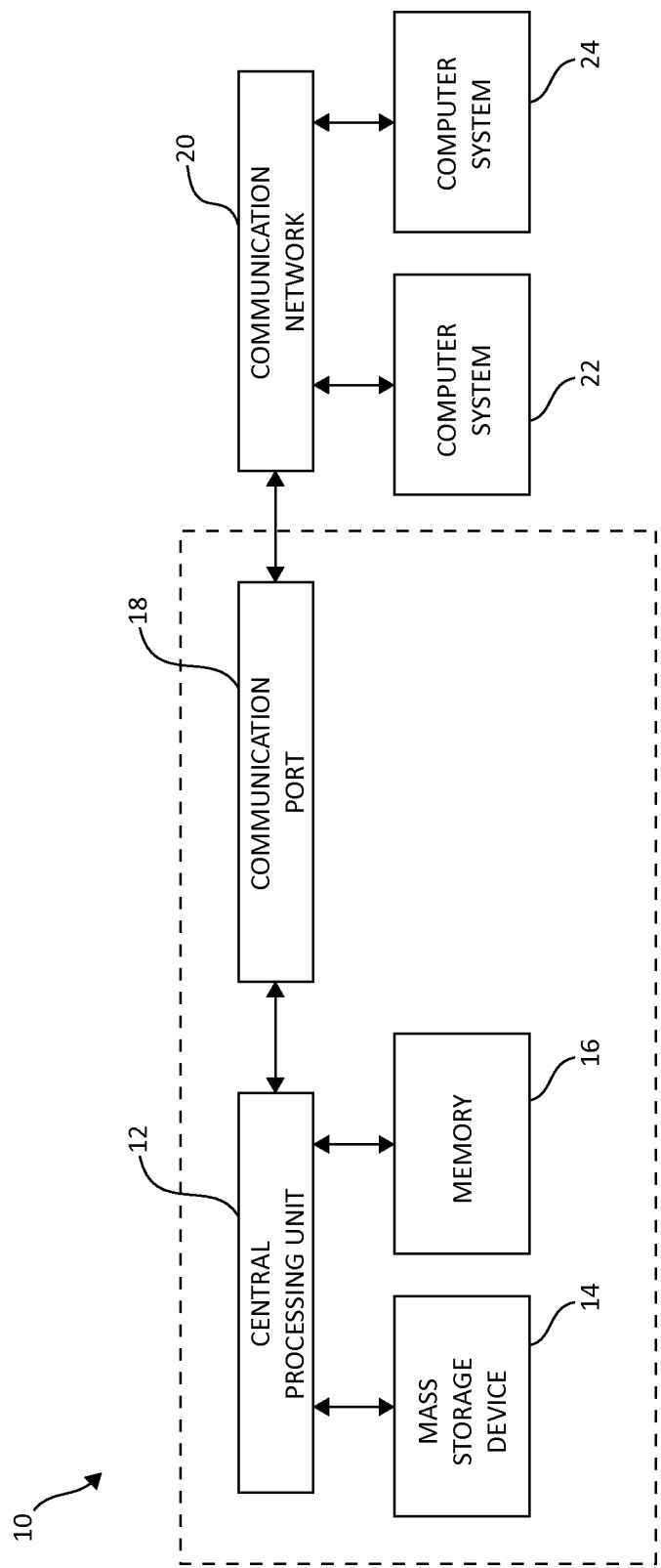
FIG. 1 illustrates a computing system environment having an example storage device in which aspects of the present invention may be realized.

Data deduplication refers to the reduction and/or elimination of redundant data. In a data deduplication process, duplicate copies of data are reduced or eliminated, leaving a minimal amount of redundant copies, or a single copy of the data, respectively. Using deduplication processes provides a variety of benefits, such as reduction of required storage capacity and increased network bandwidth.

An approach to deduplication, based on hashing, can be schematically described as follows. The available data is partitioned into parts called chunks (e.g., $C_i$ and $C_j$). These chunks may be of fixed or variable size, and the (average) size of a chunk may be small, for example, 4-8 Kilobyte (KB), up to quite large such as 16 Megabyte (MB). A cryptographically strong hash function (h) is applied to these chunks, meaning that if $h(C_i)=h(C_j)$, it may be assumed, with very low error probability, that the chunks $C_i$ and $C_j$ are identical. The set (S) of different hash values, along with pointers to the corresponding chunks, is kept in a data structure (D) allowing fast access and easy update, typically a hash table or a B-tree. For each new chunk to be treated, its hash value is searched for in D, and if it appears there, one may assume that the given chunk is a duplicate, so it is not stored again, rather, it is replaced by a pointer to its earlier occurrence. If the hash value is not in D, the given chunk is considered new, so it is stored and its hash value is adjoined to the set S.

However, difference may arise based upon how the chunk boundaries are defined and in the suggested size of the chunks. The chunk size has a major impact on the performance, and, if the chunk sizes are too small, the number of different chunks may be so large as to jeopardize the deduplication approach because the data structure D might not fit into RAM, so the system might not be scalable. On the other hand, if the chunk size is chosen too large, the probability of obtaining identical chunks decreases and, in many instances, numerous chunks exist that could have been deduplicated had the chunk size been smaller, but if the chunk size is larger, many of these chunks have to be kept.

The deduplication process may also look for similar and not only identical chunks. If a similar chunk is located, only the difference is recorded, which is generally much smaller than a full chunk. This allows the use of much larger chunks than in identity based systems. Yet, for many applications, data is more fine-grained, and a more efficient deduplication process can be performed with significantly smaller chunks. For example, a simple generalization of a system in which the chunk size could be reduced from 16 MB to 8K, for example, by a factor of 2000, without changing anything else in the design, could imply a 2000 fold increase of the size of the index, from 4 GB to about 8 TB. However, this may not be assumed to fit into RAM. Moreover, keeping the definition of the notion of similarity and reducing the size of the chunks will lead to an increased number of collisions, which may invalidate the approach altogether.

In contrast, and to address the inefficiencies previously described, the mechanisms of the illustrated embodiments serve to implement the required similarity by what shall be identified as an approximate hash scheme. The main idea is that such an approximate hash function is not sensitive to "small" changes within the chunk but behaves like other hash functions as far as the close to uniform distribution of its values is concerned. As a consequence, the mechanisms may handle the set of approximate hash values as is usually performed in hash applications (using a hash table, or storing the values in a B-Tree), but detect both similar and identical blocks. If a given chunk undergoes a more extended, but still minor, update, its new hash value may be close to the original one, which suggests that in the case of a miss, the values stored in the vicinity of the given element in the hash table should be checked. Such vicinity searches are useless in a regular hash approach.

A general algorithm for storing the repository may include using a hash table H with, for example, $2^{32}$ entries as a basic data structure. During the building process, each chunk C will be assigned its approximate hash value ah(C), and the index, or address of the chunk will be stored at H[ah(C)], the entry in H indexed by the hash value of the chunk. If the location in the table is not free, it may be overwritten. This may happen in case the new chunk is identical or very similar to a previously encountered chunk; in which case, it may be preferred to store the address of the more recent chunk for later reference, if needed. However, a collision may also be the result of two completely different chunks hashing to the same value, and then the pointer to the older chunk that has been overwritten will be lost.

In one embodiment, the mechanisms of the present invention apply specific transformations to data and determine a signature by means of which it will be possible to select the data to be deduplicated. The mechanisms partition the data into relatively small chunks (C) of fixed or variable length, with (average) size of about 8-16 K. Each chunk may be analyzed as to the distribution of the characters forming it and their corresponding frequencies of occurrence. The sequence of different characters, ordered by their frequency of occurrence in the chunk, is defined as the c-spectrum of C, and the corresponding sequence of frequencies defined as the f-spectrum of C. In addition, the mechanisms of the present invention consider the sequence of different character pairs, ordered by their frequency of occurrence in the chunk, and this sequence of pairs is defined as the p-spectrum of C. The suggested approximate hash function (referred to as ah(C)) will be a combination of certain elements of these spectra. In one embodiment, by way of example only, the size of the hash values may be fixed in advance, so as to exploit the space of the allocated hash table. For example, it may be decided that the table will have about 4 billion entries, which corresponds to a hash value of 32 bits. The chosen elements of the spectra, and more precisely, only a part of the bits of the chosen elements of the spectra, may be arranged appropriately by shifting them to the desired positions and then performing a logical XOR operation on the bit strings. In one embodiment, an approximate hash function is generated based on a combination of characters and their frequencies. The approximate hash function is used to select the data to be deduplicated.

Turning now to FIG. 1, exemplary architecture 10 of a computing system environment is depicted. The computer system 10 includes central processing unit (CPU) 12, which is connected to communication port 18 and memory device 16. The communication port 18 is in communication with a communication network 20. The communication network 20 and storage network may be configured to be in communication with server (hosts) 24 and storage systems, which may include storage devices 14. The storage systems may include hard disk drive (HDD) devices, solid-state devices (SSD) etc., which may be configured in a redundant array of independent disks (RAID). The operations as described below may be executed on storage device(s) 14, located in system 10 or elsewhere and may have multiple memory devices 16 working independently and/or in conjunction with other CPU devices 12. Memory device 16 may include such memory as electrically erasable programmable read only memory (EEPROM) or a host of related devices. Memory device 16 and storage devices 14 are connected to CPU 12 via a signal-bearing medium. In addition, CPU 12 is connected through communication port 18 to a communication network 20, having an attached plurality of additional computer host systems 24. In addition, memory device 16 and the CPU 12 may be embedded and included in each component of the computing system 10. Each storage system may also include separate and/or distinct memory devices 16 and CPU 12 that work in conjunction or as a separate memory device 16 and/or CPU 12.

Figure 2:
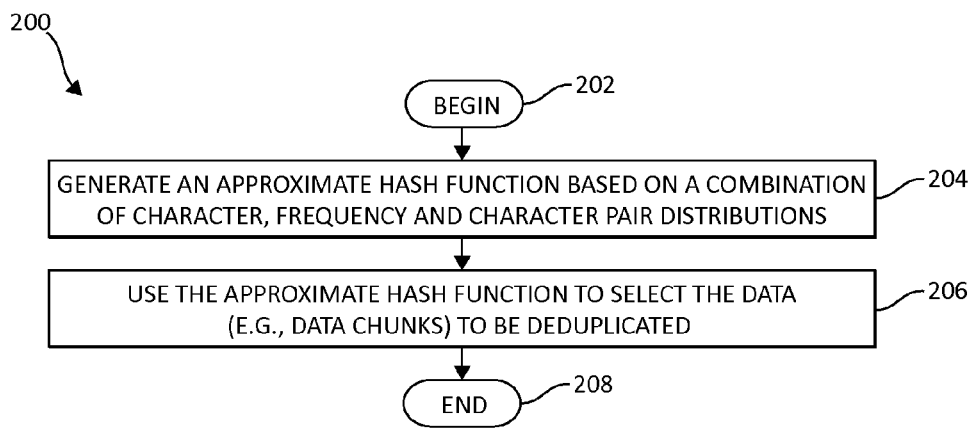
FIG. 2 is a flowchart illustrating an exemplary method for scalable data deduplication with small blocks.

FIG. 2 is a flowchart illustrating an exemplary method 200 for scalable data deduplication with small blocks. The method 200 begins (step 202) with generating a signature, which is the result of applying an approximate hash function on a small data block, based on a combination of characters, frequencies and character pairs distributions (step 204). The approximate hash function is used to decide, for a given data block, if the data block may be deduplicated (step 206). The method 200 ends (step 208).

To further illustrate the mechanisms of FIG. 2, in one embodiment a set of characters, such as $a_1, a_2, \ldots, a_n$, are defined as the sequence of different characters in the chunk, or, more precisely, as the ASCII representation of these characters, ordered by non-increasing frequency in the chunk. The ties in the frequencies of these characters may be broken by sorting the characters with identical frequency by their ASCII value. The mechanisms let $f_1 \geq f_2 \geq \ldots \geq f_n$ be, respectively, the corresponding frequencies. The number n of different characters in the chunk may vary between 1 (for chunks of identical characters, like all zeroes or blanks) and k, the size of the chunk. As this size is mostly much larger than the ASCII alphabet, one may assume that $1 \leq n \leq 256$.

The elements $a_i$ may be partitioned into blocks. The mechanisms may gather several characters together and treat them symmetrically, because it may often happen that frequencies of certain characters may be equal or very close. In such a case, a small perturbation may change the order of the characters and yield a completely different hash value, contrarily to the objective of the approximate hash function being immune to small changes. The ASCII representation of all the elements in a block may be aligned with the same offset and an XOR operation may be performed for the elements so that the internal order within the blocks may be arbitrary.

In one embodiment, the mechanisms, for defining the blocks, inspects the sizes $d_i$ of the gaps between adjacent frequencies, $d_i = f_i - f_{i+1}$, for $i = 1, \ldots, n-1$. However, sorting the gaps according to $d_i$ alone may strongly bias the definition of the gaps towards inducing blocks with single elements, since the largest gaps may tend to occur between the largest values. The sizes of the gaps are normalized by dividing by an appropriate weight and apply harmonic weights $1/i$ for $i \geq 1$ according to Zipf's law. The gaps are therefore sorted with respect to $i \times d_i = i(f_i - f_{i+1})$, which has the advantage of requiring only integer arithmetic. The l−1 (l represents the number of blocks) gaps with largest weights are chosen (for example setting l=10) and the l sets of consecutive elements delimited by the beginning of the sequence, these l−1 gaps, and the end of the sequence, are defined as the blocks.

Figure 3:
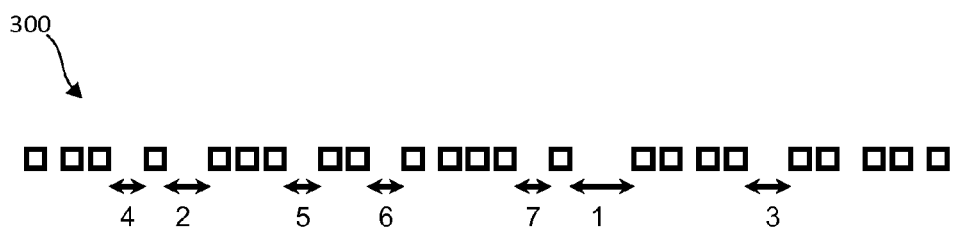
FIG. 3 illustrates an exemplary diagram showing a schematic representation of a partition into blocks of character frequencies in a computer environment in which aspects of the present invention may be realized.

FIG. 3 illustrates an exemplary block diagram showing a schematic representation of a partition into blocks in a computer environment in which aspects of the present invention may be realized. By way of example only, in FIG. 3, l=8. The squares represent elements $a_i$, the arrows represent the weighted gaps $i(f_i - f_{i+1})$, and the numbers under the arrows are the indices of the weighted gaps in non-increasing order. In FIG. 3, by way of example only, the induced blocks would consist of 3, 1, 3, 2, 4, 1, 4, and 5 elements, respectively.

Figure 4:
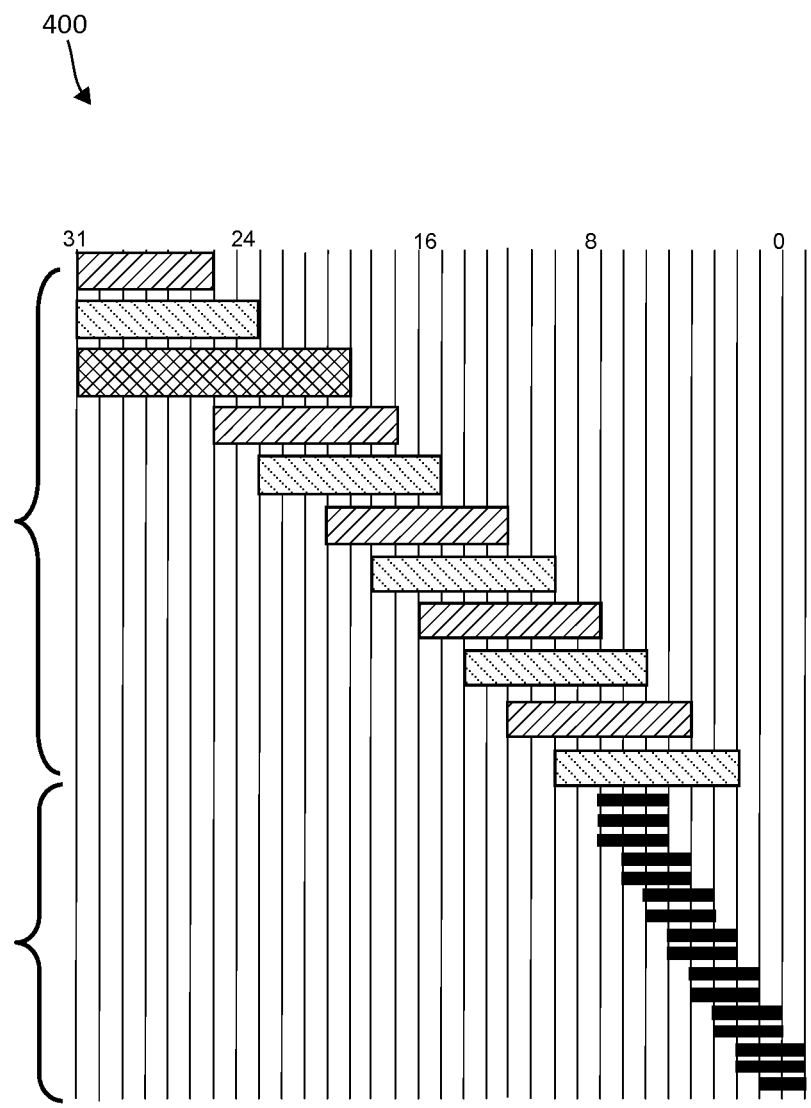
FIG. 4 illustrates an exemplary diagram showing a layout of various building components of the approximate hash function in which aspects of the present invention may be realized.

FIG. 4 illustrates an exemplary block diagram showing a layout of various components of the approximate hash function in which aspects of the present invention may be realized. In one embodiment, the various building blocks of the suggested approximate hash function illustrate 32 columns representing the 32 bits of the signature, numbered as indicated from right (0) to left (31). The blocks with the up-right to down-left lines represent blocks of characters $a_i$ and indicate that the ASCII representation of the characters is taken in its original form. The blocks with up-left to down-right lines indicate that the ASCII representation of the characters are taken in reverse, e.g., 11101010 instead of 01010111 for the letter W in ASCII. The block with cross-hashed filling represents a block of character pairs. The smaller bars in the lower right part of the figure represent the frequencies (i.e., the elements of the f-spectrum.)

In one embodiment, the number of blocks is l=10, and the size of the last block is truncated, if necessary, to include at most 10 characters. There may also be lower bounds on the number of occurrences of a character to be considered, such as (15) and on the size $d_i$ of a gap (5). If after these adjustments, the number of blocks in a given chunk is smaller than 10, a different layout may be chosen that is adapted to the given number of blocks. The layout in FIG. 4 assumes that l=10 blocks are given. A complete description treating all the possible values l of can be found in the flowchart of FIGS. 7A-7C.

Moreover, each data block taken from the c-spectrum may be of size 8 bits, using the full ASCII representation, except for the first block of the most frequent characters, for which the first (leftmost) 2 bits may be pruned. Each of these blocks may be shifted, and more specifically, the first block may be shifted by 26 bits to the left (e.g., left justified in the 32-bit layout) and the next block may be shifted 24 bits, then 18, 16, 13, 11, 9, 7, 5 and 3 bits. The straight and reversed representations of the characters may be alternating.

The elements of the f-spectrum may be incorporated into the signature as described below. For each frequency value, which may be an integer between 1 and 8192, the mechanisms consider first the frequency value as a standard binary representation (e.g., in 16 bits), and extend this string by 8 additional zeros to the right. Thus, the mechanisms assign to each frequency $f_i$ a 24-bit string $F_i$, for example, if $f_i=5$, then $F_i$=00000000 00000101 00000000. The mechanisms define $D_i$ as the substring of $F_i$ of length 3 bits, starting at the position immediately following the most significant 1-bit, for the above example 00000000 00000101 00000000, the bits forming $D_i$ are emphasized. By way of illustration, another example with a value of more than 8 bits is given by considering $f_i$=759, 00000010 11110111 00000000 then displays both $F_i$ and $D_i$. (emphasis added). In one embodiment, the size of all the elements is chosen as 3 bits, except the first, which is only of length 2 bits, and this in addition to the lower bound of 15 of the values in the f-spectrum implies that the right padding with zeros is never needed. However, other embodiments may lower the bound and increase the bit-size of the values. The offsets in bits of these elements are as indicated: 0, 0, 0, 1, 1, 2, 2, 3, 3, 4, 4, 5, 5, 6, 6 and 6, with the first (largest) frequency being depicted as the lowest element FIG. 4.

The block of the p-spectrum of C may be of length 12 bits and may be placed left justified in the layout. In one embodiment, the p-spectrum of C may be defined by ordering the pairs by non-increasing frequencies and consider those indexed as 5, 6, 7, 8 and 9 (i.e. 5$^{th}$ through 9$^{th}$ block) in this ordering. The reason for not choosing the most frequent pairs as performed for the characters is that their distribution is much more biased, with the pairs (0,0) and (255,255) appearing as the most frequent in an overwhelming majority of the cases we tested.

For each of the 5 pairs, the following bit string may be constructed. Given the 2 bytes $A = a_7 a_6 a_5 a_4 a_3 a_2 a_1 a_0$ and $B = b_7 b_6 b_5 b_4 b_3 b_2 b_1 b_0$, the mechanisms may rotate A cyclically to the left by 3 bits and B cyclically to the right by 3 bits. The bytes may be aligned so that the rightmost 4 bits of A overlap with the leftmost 4 bits of B and then a XOR logic operation may be performed on the bit strings. Thus, the 12 resulting bits may now be illustrated as $a_4, a_3, a_2, a_1, a_0\hat{\,}b_2, a_7\hat{\,}b_1, a_6\hat{\,}b_0 a_5\hat{\,}b_7, b_6, b_5, b_4, b_3$, where the notation $a\hat{\,}b$ is used for a XOR b. The most and least significant bits of both A and B are in the overlapping part, so if their distribution is biased, they have an additional chance to correct the bias by the additional XOR logic operation. Finally, a XOR logic operation may be performed on all the elements of the layout yielding a 32 bit string, representing a number between 0 and $2^{32}-1$ that may act as the hash value of the given chunk C.

By way of example only, and to illustrate the performance of the signature to show the uniformity of distribution, a subset of an Exchange database of about 27 GB has been chosen and a file of about 5 GB. In the chosen embodiment, the chunk was of variable length size. The boundary of a chunk was defined by applying a simple Rabin-Karp rolling hash on the d rightmost bytes of the chunk under consideration. If this hash value equals some predefined constant c, the chunk was truncated after these d bytes; otherwise, a byte was adjoined and the test with the rolling hash was repeated. In the chosen embodiment, d=25, c=2718 and the hash function was RK(x)=x modP where RK is the Rabin-Karp rolling hash value, x is a variable, $P=2^{48}-257$ is a prime number, and mod stands for the modulus function, defined by A mod B is the remainder of the division of A by B, where both A and B are integers, or in mathematical notation:

$$A \bmod B = A - B \times \lfloor A/B \rfloor.$$

To avoid extreme values for the chunk lengths, a lower limit of 2K and an upper limit of 64K are imposed as an example. The average size of a chunk was then about 12K on the test databases.

Figure 5:
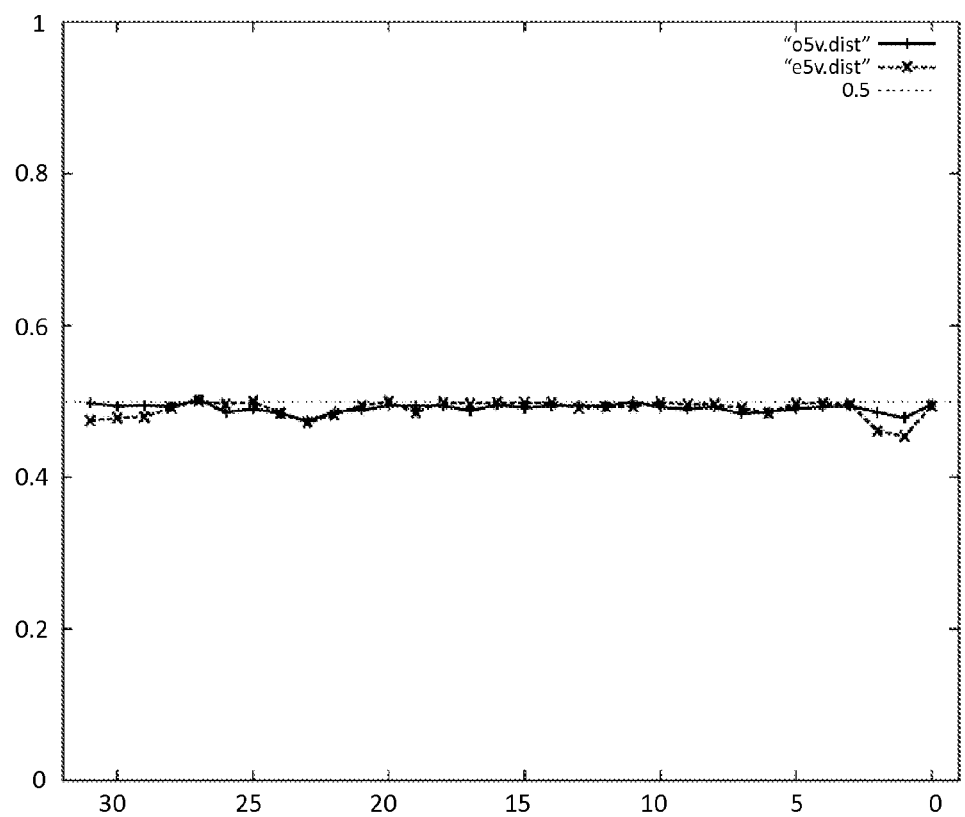
FIG. 5 is a graph showing the probability, on a test database of size 32 GB, of obtaining a 1-bit in each of the 32 bit-positions of the defined signature.

FIG. 5 illustrates a graph showing the probability, on an exemplary test database, of obtaining a 1-bit in each of the 32 bit positions of the signatures. The vertical axis indicates the probability values from 0 to 1, and the horizontal axis indicates the 32 bit positions, indexed 0 to 31. As can be seen in FIG. 5, the probabilities, for all bit positions, are very close to the expected value of 0.5 for a random distribution.

Figure 6:
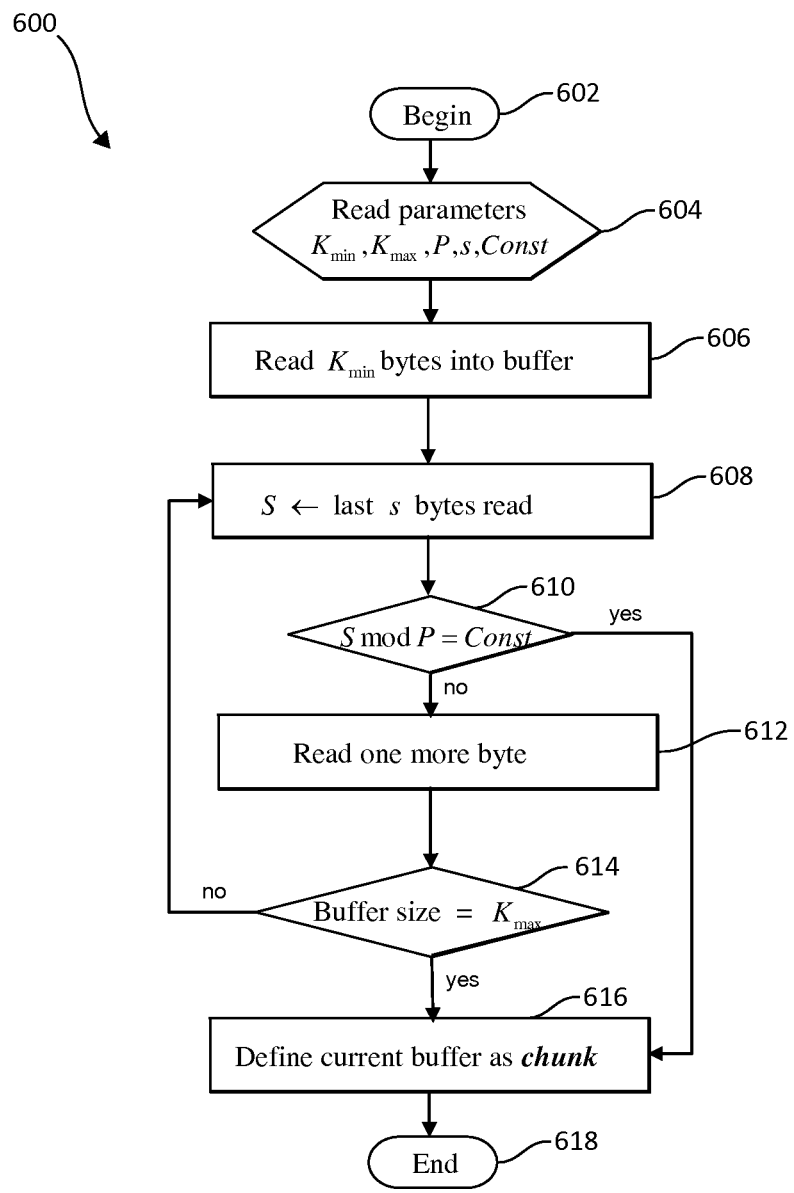
FIG. 6 is a flowchart illustrating an exemplary method for defining data chunks.

FIG. 6 is a flowchart illustrating an exemplary method 600 for defining data chunks. The method 600 begins (step 602) by reading the parameters $K_{min}, K_{max}, P, s, Const$ where $K_{min}$ and $K_{max}$ are the minimal and maximal sizes we allow for a chunk (step 604), P is the prime number used in the Rabin-Karp hash, s is the number of bytes on which the Rabin Karp hash is applied and Const is some fixed integer constant $0 \leq Const < P$. $K_{min}$ bytes are read into the buffer (step 606). Let S denote the value of the last s bytes read when they are considered as representing an integer (step 608). The method 600 will then determine if S mod P=Const (step 610). If yes, the method 600 will define the current buffer as a chunk (step 616). If no, the method 600 will read one more byte (step 612). The method 600 then determines if the buffer size equals the parameter $K_{max}$ (step 614). If no, the method 600 returns to step 608. If yes, the method 600 will define the current buffer as a chunk (step 616) and the method 600 ends (step 618).

Figure 7A:
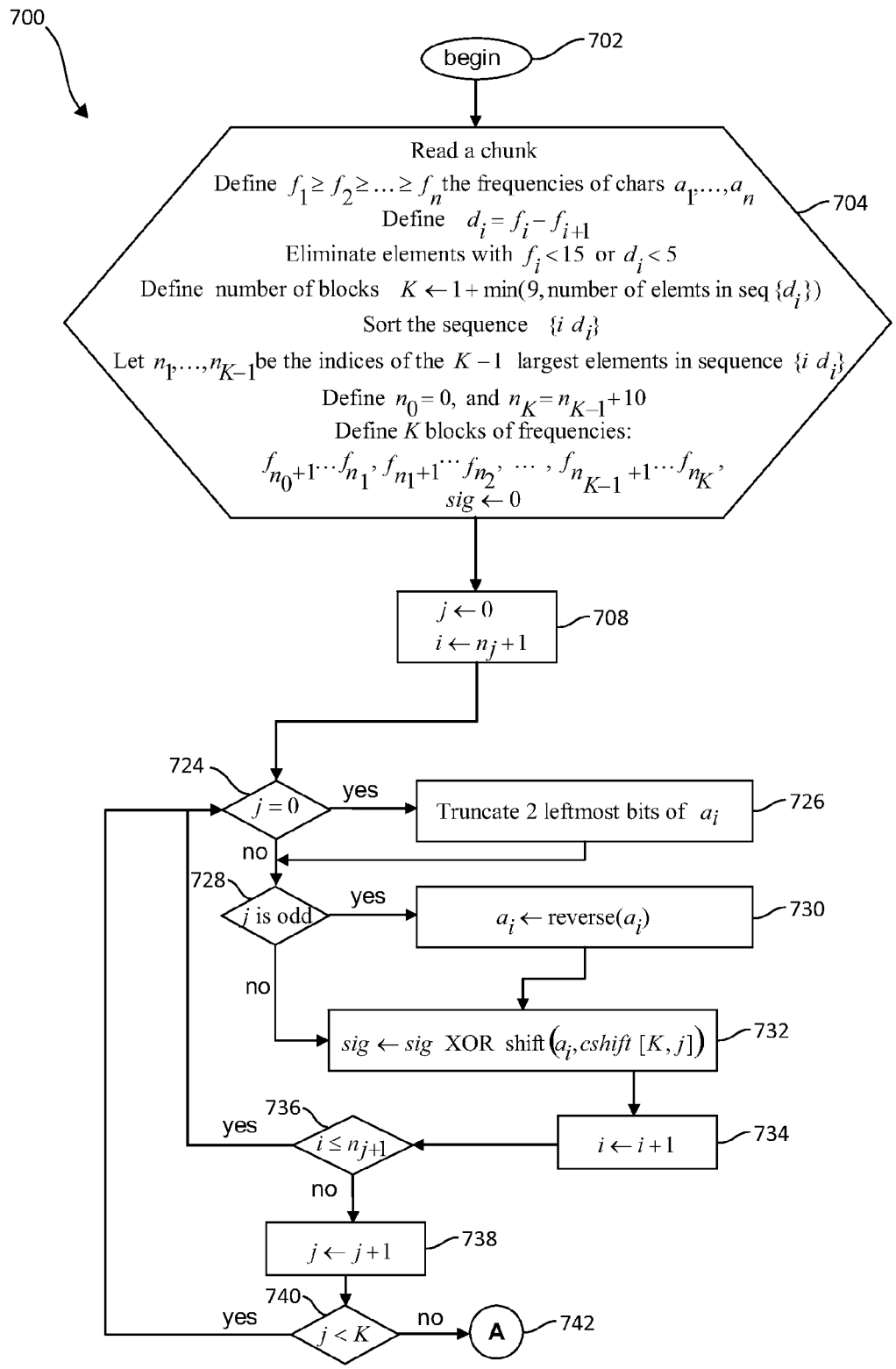
FIG. 7a is a flowchart illustrating an exemplary method for defining the character part of the signature definition.
Figure 7B:
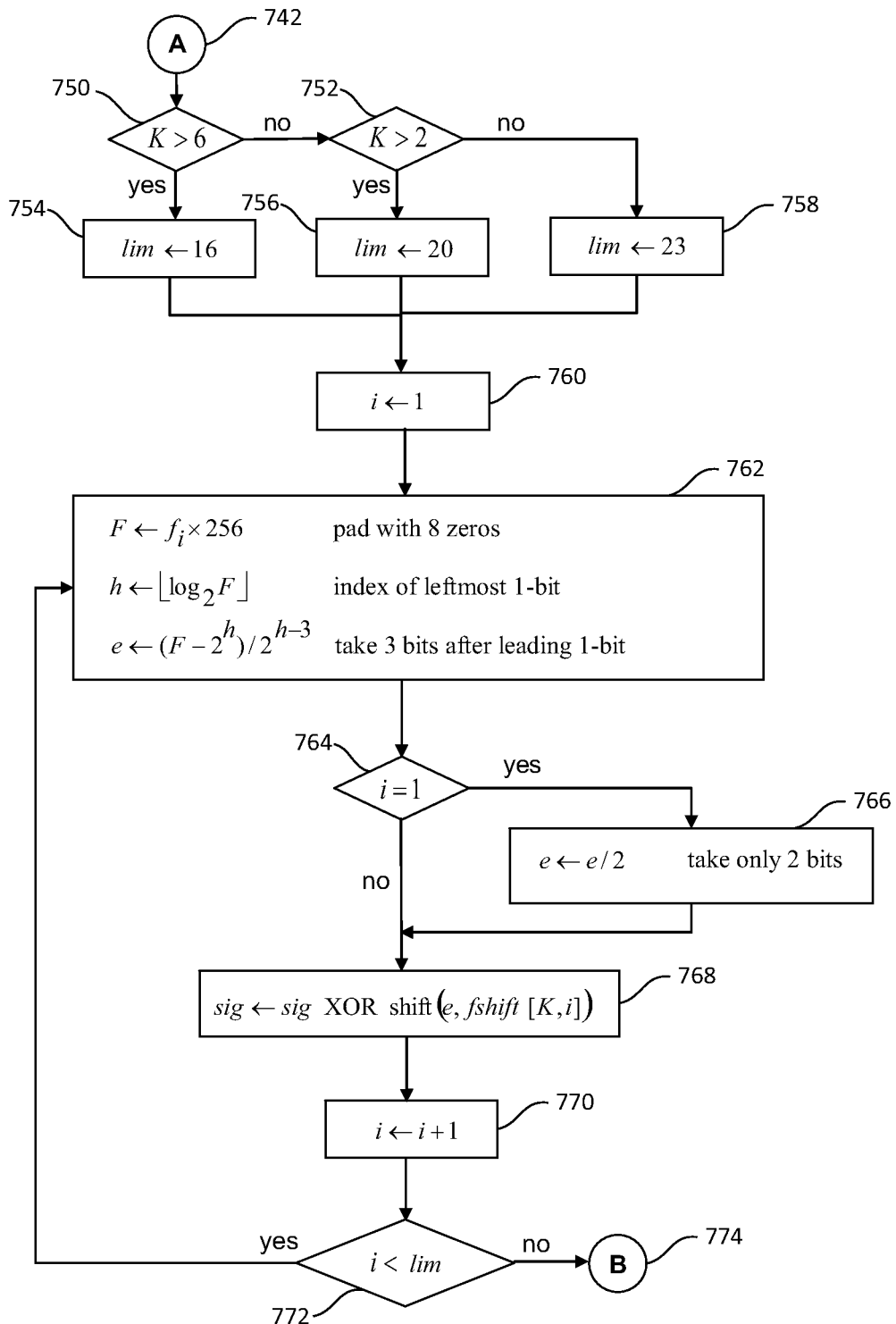
FIG. 7b is a flowchart illustrating an exemplary method for defining the frequency part of the signature definition.
Figure 7C:
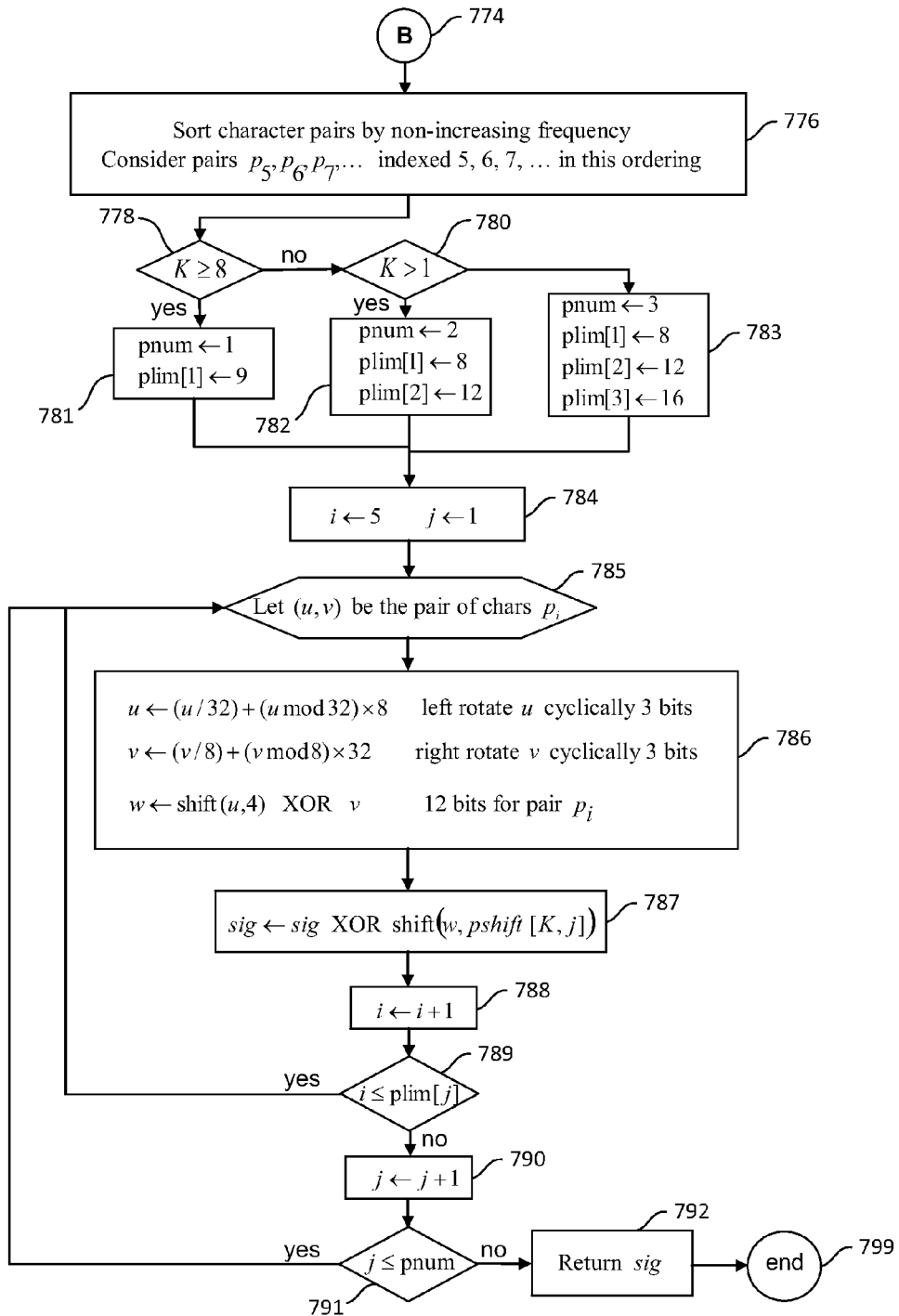
FIG. 7c is a flowchart illustrating an exemplary method for defining the character pairs part of the signature definition.

FIGS. 7a, 7b and 7c illustrate is a method 700 for signature definition. For technical reasons, the flowchart of method 700 is split into three parts, FIGS. 7a, 7b and 7c, dealing, respectively, with characters, frequencies and character pairs, yet FIGS. 7a, 7b and 7c all are apart of method 700. FIG. 7a is a flowchart illustrating an exemplary method for defining the character part of the signature definition. In FIG. 7a, dealing with the characters, the method 700 begins at step 702 and then initializes the parameters by reading a chunk, defining the set of characters $a_1, a_2, \ldots, a_n$, which are the sequence of different characters in the chunk, indexed according to non-increasing order of their frequencies within the chunk, defining $f_1 \geq f_2 \geq \ldots \geq f_n$, respectively, as the corresponding frequencies, defining the sizes $d_i$ of the gaps between the frequencies as $d_i = f_i - f_{i+1}$, for $i=1, \ldots, n-1$, eliminating elements $a_i$ for which $f_i < 15$ or $d_i < 5$, defining the number of blocks K by $K \leftarrow 1 + \min(9, $ number of elements in sequence $d_i$), sorting the sequence i $d_i$, and letting $n_1, \ldots, n_{K-1}$ be the indices of the K-1 largest elements in sequence i $d_i$, defining $n_o = 0$, and $n_K = n_{K-1} + 10$, and defining K blocks of frequencies as $f_{n_o+1} \ldots f_{n_1}$ (first block), $f_{n_1+1} \ldots f_{n_2}$ (second block), $\ldots$, $f_{n_{K-1}+1} \ldots f_{n_K}$ (K-th block) (step 704). The signature to be built, sig, is initialized as a 32-bit long integer consisting only of zeros. Continuing at step 708, after the method 700 sets a parameter j representing the index of the block as zero and a parameter i representing the index of the current character as $n_j+1$ (step 708), the method 700 will determine if j=0 (step 724). If yes, the method 700 will truncate the 2 leftmost bits of $a_i$ (step 726) and then move to step 728. In any case, the method 700 then determines if j is odd (step 728). If yes the ASCII representation of $a_i$ is reversed (step 730). In any case, the method 700 will then execute the function sig←sig XOR shift ($a_i$,cshift[K,j]) (step 732), which performs a logical XOR operation of the current value stored in sig with the ASCII representation of the character $a_i$ that has been shifted into a position determined by the index j of the block and the total number of blocks K. The exact amounts of these shifts are given in the table cshift[K,j], which is an external parameter of the signature scheme (not depending on a specific chunk), and are given in FIG. 8. The method 700 will then increment i by 1 (step 734). The method 700 will then determine whether there are still elements in the current block indexed j to be processed by checking if $i \leq n_{j+1}$ (step 736). If yes, the method 700 will return to step 724. If no, the method 700 will try to pass to the next block by incrementing j by 1 (step 738). The method 700 will then determine whether there are still blocks to be processed, by checking if j<K (step 740). If yes, the method 700 will return to step 724 to perform an additional iteration of the loop. If no, the method 700 continues to connection point A (step 742), which is the entry point to the next part of the flowchart, dealing with the frequencies, and displayed in FIG. 7b.

FIG. 7b is a flowchart illustrating an exemplary method 700 for defining the frequency part of the signature definition. In FIG. 7b dealing with the frequencies, the method 700 starts at entry point A (step 742) and selects the number of frequencies involved in the definition of the signature according to the number K of available blocks. If K>6 (step 750), the number lim of frequencies is set to 16 (step 754); otherwise, if K>2 (step 752), the number lim of frequencies is set to 20 (step 756); still otherwise, that is, if K=2 or K=1 or K=0, the number lim of frequencies is set to 23 (step 758). In all cases, the method 700 passes to step 760 and initializes the parameter i, representing the index of the frequency $f_i$, setting it to 1. In step 762, a substring of length 3 bits is extracted from the binary representation of the frequency $f_i$, as explained above in FIG. 4. More specifically, F is the result of padding $f_i$ with 8 zeros on its right end, which is equivalent to multiplying $f_i$ by 256, Note that $f_i$, and thus F, cannot be zero. The method 700 then sets the parameter h to $\lfloor \log_2 F \rfloor$, which is the index of the leftmost 1-bit in the binary representation of F, starting to count at the rightmost bit, which is indexed 0. Finally, the 3 bits after the leading 1-bit of F are obtained in e by subtracting $2^h$ from F, which cancels the leading 1-bit, and then dividing by $2^{h-3}$ which deletes the h−3 rightmost bits, leaving just 3 bits, as requested. The method 700 then checks in step 764 whether we deal with the first frequency by checking if i=1, and if so, the value of e is halved in step 766, which is equivalent to deleting the rightmost of its 3 bits. In any case, the method 700 will then execute sig←sig XOR shift(e,fshift[K,i]) (step 768), which performs a logical XOR operation of the current value stored in sig with the 2 or 3 bits of the value e that has been shifted into a position determined by the index i of the element and the total number of blocks K. The exact amounts of these shifts are given in the table fshift[K,i], which is an external parameter of the signature scheme (not depending on a specific chunk), and are given in FIG. 8. The method 700 will then increment i by 1 (step 770), and determine whether there are still frequencies to be processed by checking if i (step 772). If yes, the method 700 will return to step 762 to perform an additional iteration of the loop. If no, the method 700 continues to connection point B (step 774), which is the entry point to the next part of the flowchart, dealing with the character pairs, and displayed in FIG. 7c.

FIG. 7c is a flowchart illustrating an exemplary method 700 for defining the character pairs part of the signature definition. In FIG. 7c, dealing with the character pairs, the method 700 starts at entry point B (step 774). In step 776, the character pairs are first sorted into non-increasing order according to their frequency of occurrence within the chunk. The pairs to be considered by method 700 are those indexed, in the order yielded by the sorting, 5 or higher. The pairs are processed in clusters of several pairs. The number of clusters, pnum, and which pairs belong to each of the clusters, are determined according to the number K of available blocks. The partition of the pairs into clusters is implemented by means of an array plim[j], $1 \leq j \leq plim[j]$ giving the index of the last pair in cluster j. If $K \geq 8$ (step 778), the number pnum of clusters is set to 1 and plim[1] is set to 9, so that the only cluster in this case consists of the 5 pairs indexed 5, 6, 7, 8 and 9 (step 781); otherwise, if K>1 (step 780), the number pnum of clusters is set to 2, plim[1] is set to 8, and plim[2] is set to 12, so that the first of the two clusters in this case consists of the 4 pairs indexed 5, 6, 7, and 8, and the second cluster consists of the 4 pairs indexed 9, 10, 11 and 12 (step 782); still otherwise, that is, if K=1 or K=0, the number pnum of clusters is set to 3, plim[1] is set to 8, plim[2] is set to 12, and plim[3] is set to 16, so that the first of the three clusters in this case consists of the 4 pairs indexed 5, 6, 7, and 8, the second cluster consists of the 4 pairs indexed 9, 10, 11 and 12, and the third cluster consists of the 4 pairs indexed 13, 14, 15 and 16 (step 783). In all cases, the method 700 passes then to step 784 and initializes the parameter i, representing the index of the pair, setting it to 5, as well as the parameter j, representing the index of the cluster, setting it to 1.

In step 785, the method 700 then starts a loop processing a single pair $p_i$ in each iteration. u and v are defined as the characters forming the pair $p_i$. In step 786, a string w of length 12 bits is formed as function of the ASCII representation of u and v. More specifically, u is cyclically rotated left by 3 bits, v is cyclically rotated right by 3 bits, and the result w is obtained by applying a logical XOR operation on the rotated strings, after having shifted u by 4 bits to the left. The method 700 will then execute sig←sig XOR shift(w,pshift [K,j]) (step 787), which performs a logical XOR operation of the current value stored in sig with the 12 bits of the value w that have been shifted into a position determined by the index j of the cluster and the total number of blocks K. The exact amounts of these shifts are given in the table pshift [K,j], which is an external parameter of the signature scheme (not depending on a specific chunk), and are given in FIG. 8. The method 700 will then increment i by 1 (step 788), and determine whether there are still pairs to be processed within this cluster by checking if i≤plim[j] (step 789). If yes, the method 700 will return to step 785 to perform an additional iteration of the loop with another pair of the same cluster. If no, the method 700 will increment j by 1 (step 790), and determine whether there are still more clusters to be processed by checking if j≤pnum (step 791). If yes, the method 700 will return to step 785 to perform an additional iteration of the loop with another cluster. If no, the method 700 outputs the evaluated signature sig (step 792) and ends (step 799).

FIG. 8 defines the shift constants used in the flowcharts of FIGS. 7a, 7b and 7c. The tables are given in C-style, with indices starting from 0, so the first line and first column are not used. The first parameter is the given number of blocks K. The second parameter is:

a) For cshift: the index j of the block of characters;
b) For fShift: the index i of the frequency;
c) For pshift: the index pnum of the number of pairs used (1 to 3)

For K≥8, only one pair is used, elements indexed 5-6-7-8-9

For 2≤K≤7 2 pairs are used: 5-6-7-8 and 9-10-11-12

For K=1 3 pairs are used: 5-6-7-8, 9-10-11-12 and 13-14-15-16

The last index of these element blocks is given in plim[j].

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While one or more embodiments of the present invention have been illustrated in detail, the skilled artisan will appreciate that modifications and adaptations to those embodiments may be made without departing from the scope of the present invention as set forth in the following claims.

In particular, changing any of the constants $K_{min}, K_{max}, P$, s, Const that appear in step 604 of FIG. 6, or of the constants that appear in the flowcharts of the FIG. 7a, 7b or 7c in steps 704, 726, 750, 752, 754, 756, 758, 762, 766, 776, 778, 780, 781, 782, 783, 784, 786, or any value in the tables cshift, fshift and pshift in FIG. 8, may result in a completely different signature sig that might as well reach the objectives of the present invention. The specific constants used above are thus given by way of an example for a possible implementation only and should not be understood as restricting the scope of the invention to these values alone.

What is claimed is:

1. A method for scalable data deduplication working with small data chunks, the method comprising:
for each small data chunk, generating, by a processor, a signature based on a combination of a representation of characters that appear in the small data chunk and a representation of frequencies of the characters in the small data chunk, the signature used in selecting data to be deduplicated by matching the generated signature of the small data chunk to signatures of data chunks stored in a repository, wherein the representation of characters and the representation of frequencies of the characters comprising:
a c-spectrum of the small data chunk comprising a sequence of representations of different characters ordered by a frequency of occurrence in the small data chunk, and
an f-spectrum of the small data chunk comprising a corresponding sequence of frequencies of the different characters in the small data chunk; and
in conjunction with generating the signature based on the c-spectrum and the f-spectrum, performing one or more of:
combining characters of the c-spectrum having similar frequencies into blocks, by weighing gaps $d_i = f_i - f_{i+1}$ between frequencies $f_i$ of characters that are adjacent in an ordered sequence, wherein the gaps are normalized based upon weights,
selecting a subset of the gaps for defining boundaries of blocks of characters of the c-spectrum,
performing a logical XOR operation on a combination of characters in blocks of characters of the c-spectrum, and
selecting a subset of bits of a subset of frequencies of the f-spectrum.

2. The method of claim 1, wherein the signature is based on the c-spectrum of the small data chunk and the f-spectrum of the small data chunk, and
the signature is generated to provide for small modifications in the small data chunk to cause one of small changes and no changes in the signature.

3. The method of claim 1, further including performing shifting operations on the selected subset of bits and performing a logical XOR operation by combining the selected subsets of bits into a bitstring representing a signature.

4. The method of claim 3, further including performing the shifting operations according to parameter tables.

5. The method of claim 1, wherein weights $w_i$ by which the gaps $d_i = f_i - f_{i+1}$ are normalized are $w_i = 1/i$.

6. A system for scalable data deduplication working with small data chunks in a computing storage environment, comprising:
at least one processor device, operable in the computing environment, wherein the at least one processor device:
for each small data chunk, generates, by the at least one processor device, a signature based on a combination of a representation of characters that appear in the small data chunk and a representation of frequencies of the characters in the small data chunk, the signature used in selecting data to be deduplicated by matching the generated signature of the small data chunk to signatures of data chunks stored in a repository, wherein the representation of characters and the representation of frequencies of the characters comprising:
a c-spectrum of the small data chunk comprising a sequence of representations of different characters ordered by a frequency of occurrence in the small data chunk, and
an f-spectrum of the small data chunk comprising a corresponding sequence of frequencies of the different characters in the small data chunk; and
in conjunction with generating the signature based on the c-spectrum and the f-spectrum, performing one or more of:
combining characters of the c-spectrum having similar frequencies into blocks, by weighing gaps $d_i = f_i - f_{i+1}$ between frequencies $f_i$ of characters that are adjacent in an ordered sequence, wherein the gaps are normalized based upon weights,
selecting a subset of the gaps for defining boundaries of blocks of characters of the c-spectrum,
performing a logical XOR operation on a combination of characters in blocks of characters of the c-spectrum, and
selecting a subset of bits of a subset of frequencies of the f-spectrum.

7. The system of claim 6, wherein the signature is based on the c-spectrum of the small data chunk and the f-spectrum of the small data chunk, and
the signature is generated to provide for small modifications in the small data chunk to cause one of small changes and no changes in the signature.

8. The system of claim 6, wherein the at least one processor device performs shifting operations on the selected subset of bits and performs a logical XOR operation by combining the selected subsets of bits into a bitstring representing a signature.

9. The system of claim 8, wherein the at least one processor device performs the shifting operations according to parameter tables.

10. The system of claim 6, wherein weights $w_i$ by which the gaps $d_i = f_i - f_{i+1}$ are normalized are $w_i = 1/i$.

11. A computer program product for scalable data deduplication working with small data chunks by a processor device, the computer program product comprising a non-transitory computer-readable storage medium having computer-readable program code portions stored therein, the computer-readable program code portions comprising:
a first executable portion for, for each small data chunk, generating, by the processor device, a signature based on a combination of a representation of characters that appear in the small data chunk and a representation of frequencies of the characters in the small data chunk, the signature used in selecting data to be deduplicated by matching the generated signature of the small data chunk to signatures of data chunks stored in a repository, wherein the representation of characters and the representation of frequencies of the characters comprising:
a c-spectrum of the small data chunk comprising a sequence of representations of different characters ordered by a frequency of occurrence in the small data chunk, and
an f-spectrum of the small data chunk comprising a corresponding sequence of frequencies of the different characters in the small data chunk; and
a second executable portion for, in conjunction with generating the signature based on the c-spectrum and the f-spectrum, performing one or more of:
combining characters of the c-spectrum having similar frequencies into blocks, by weighing gaps $d_i = f_i - f_{i+1}$ between frequencies $f_i$ of characters that are adjacent in an ordered sequence, wherein the gaps are normalized based upon weights,
selecting a subset of the gaps for defining boundaries of blocks of characters of the c-spectrum,
performing a logical XOR operation on a combination of characters in blocks of characters of the c-spectrum, and
selecting a subset of bits of a subset of frequencies of the f-spectrum.

12. The computer program product of claim 11, wherein the signature is based on the c-spectrum of the small data chunk and the f-spectrum of the small data chunk, and
the signature is generated to provide for small modifications in the small data chunk to cause one of small changes and no changes in the signature.

13. The computer program product of claim 11, further including a third executable portion for:
performing shifting operations on the selected subset of bits and performing a logical XOR operation by combining the selected subsets of bits into a bitstring representing a signature.

14. The computer program product of claim 13, further including a fourth executable portion for:
performing the shifting operations according to parameter tables.

15. The computer program product of claim 11, wherein weights $w_i$ by which the gaps $d_i = f_i - f_{i+1}$ are normalized are $w_i = 1/i$.

* * * * *